(12) United States Patent
Kim et al.

(10) Patent No.: US 10,074,903 B2
(45) Date of Patent: Sep. 11, 2018

(54) ANTENNA APPARATUS

(71) Applicant: HiDeep Inc., Gyeonggi-do (KR)

(72) Inventors: Bumkyum Kim, Gyeonggi-do (KR);
Taeyeop Lee, Gyeonggi-do (KR);
Youngho Cho, Gyeonggi-do (KR);
Bonkee Kim, Gyeonggi-do (KR)

(73) Assignee: HIDEEP INC. (KR)

( * ) Notice: Subject to any disclaimer, the term of this patent is extended or adjusted under 35 U.S.C. 154(b) by 101 days.

(21) Appl. No.: 14/524,735

(22) Filed: Oct. 27, 2014

(65) Prior Publication Data

US 2015/0116167 A1    Apr. 30, 2015

(30) Foreign Application Priority Data

Oct. 28, 2013 (KR) .......... 10-2013-0128212

(51) Int. Cl.
| | |
|---|---|
| *H01Q 5/00* | (2015.01) |
| *H01Q 5/328* | (2015.01) |
| *H01Q 5/335* | (2015.01) |
| *H01Q 9/04* | (2006.01) |
| *H01Q 9/06* | (2006.01) |
| *H01Q 13/08* | (2006.01) |
| *H01Q 13/10* | (2006.01) |
| *H03H 7/38* | (2006.01) |

(52) U.S. Cl.
CPC ............ *H01Q 5/328* (2015.01); *H01Q 5/335* (2015.01); *H01Q 9/0407* (2013.01); *H01Q 9/065* (2013.01); *H01Q 13/085* (2013.01); *H01Q 13/103* (2013.01); *H03H 7/38* (2013.01)

(58) Field of Classification Search
CPC .... H01Q 5/328; H01Q 13/103; H01Q 13/085; H01Q 9/065; H01Q 9/0407; H01Q 5/335; H03H 7/38
See application file for complete search history.

(56) References Cited

U.S. PATENT DOCUMENTS

| | | |
|---|---|---|
| 2004/0075614 A1 | 4/2004 | Dakeya et al. |
| 2006/0262028 A1 | 11/2006 | Takei |
| 2009/0121960 A1 | 5/2009 | Sangawa |

FOREIGN PATENT DOCUMENTS

| | | |
|---|---|---|
| JP | 1992233303 | 8/1992 |
| JP | 2004242269 | 8/2004 |
| KR | 100782301 | 11/2007 |

(Continued)

OTHER PUBLICATIONS

Corresponding Office Action issued by the KIPO on Apr. 14, 2015.

(Continued)

*Primary Examiner* — Jessica Han
*Assistant Examiner* — Michael Bouizza
(74) *Attorney, Agent, or Firm* — The Belles Group, P.C.

(57) ABSTRACT

An antenna apparatus may be provided that includes: a radiating metal; a ground which is connected to the radiating metal; a first impedance which forms a first path by being connected between the radiating metal and the ground, has an impedance value which is changed depending on a frequency, and opens the first path in response to a predetermined frequency, and a second impedance which forms a second path parallel with the first path by being connected between the radiating metal and the ground, has an impedance value which is changed depending on a frequency, and short-circuits the second path in response to the predetermined frequency.

12 Claims, 8 Drawing Sheets

(56) References Cited

FOREIGN PATENT DOCUMENTS

| KR | 1007784411 | 12/2007 |
|---|---|---|
| KR | 1020120046962 | 5/2012 |

OTHER PUBLICATIONS

Corresponding Office Action issued by KIPO on Oct. 30, 2014.
Corresponding Office Action issued by the JPO on Nov. 24, 2015.
Corresponding European Search Report dated Mar. 20, 2015.
Corresponding Office Action issued by the EPO dated Apr. 18, 2017.

US 10,074,903 B2

ANTENNA APPARATUS

CROSS REFERENCE TO RELATED APPLICATIONS

Priority is claimed under 35 U.S.C. § 119 to Korean Patent Application No. 10-2013-0128212, filed Oct. 28, 2013, the disclosure of which is incorporated herein by reference in its entirety.

FIELD OF THE INVENTION

The Embodiments relate to an antenna apparatus, and more particularly to an antenna apparatus capable of causing a high-frequency band and a low-frequency band to become broad bands.

BACKGROUND OF THE INVENTION

Mobile communication subscribers are annually increasing and mobile communication technologies are also developing. A mobile communication device uses recently Long Term Evolution (LTE) as well as Code Division Multiple Access (CDMA). Wideband Code Division Multiple Access (WCDMA) as a mobile communication standard. The mobile communication device also uses Global Positioning System (GPS) and Wi-Fi.

The mobile communication device like a smartphone prefers a built-in antenna to an external antenna. The built-in antenna includes an inverted F antenna, a Planar inverted F antenna, an Inverted L antenna, and a Planar inverted L antenna, etc.

Further, the smartphone is required to process signals from various frequency bands according to a trend of the multi-functionality. Therefore, there is a necessity for the smartphone to be optimized for a low-frequency signal and a high-frequency signal and to minimize the transmission loss of the signal in the transmission/reception of the signal.

SUMMARY OF THE INVENTION

One embodiment is an antenna apparatus that includes; a radiating metal; a first impedance which is connected between the radiating metal and a ground, has an impedance value which is changed depending on a frequency, and resonates in response to a predetermined frequency, so that an open-circuit occurs between the radiating metal and the ground; and a second impedance which is connected between the radiating metal and the ground, has an impedance value which is changed depending on a frequency, and resonates in response to the predetermined frequency, so that a short-circuit occurs between the radiating metal and the ground (GND).

A first inductor and a first capacitor of the first impedance are connected in parallel to each other.

A second inductor and a second capacitor of the second impedance are connected in series to each other.

The first impedance becomes an inductor component in response to a signal having a frequency less than the predetermined frequency. The second impedance becomes a capacitor component in response to a signal having a frequency less than the predetermined frequency. The inductor component and the capacitor component resonate at the signal having a frequency less than the predetermined frequency.

The first impedance becomes a capacitor component in response to a signal having a frequency greater than the predetermined frequency. The second impedance becomes an inductor component in response to a signal having a frequency greater than the predetermined frequency. The capacitor component and the inductor component resonate at the signal having a frequency greater than the predetermined frequency.

The antenna apparatus includes a third impedance and a fourth impedance which are connected in series to the radiating metal. The third impedance is opened in response to the predetermined frequency. The fourth impedance is short-circuited in response to the predetermined frequency.

A third inductor and a third capacitor of the third impedance are connected in parallel to each other.

A fourth inductor and a fourth capacitor of the fourth impedance are connected in series to each other.

The third impedance becomes an inductor component in response to a signal having a frequency less than the predetermined frequency. The fourth impedance becomes a capacitor component in response to a signal having a frequency less than the predetermined frequency. The inductor component and the capacitor component resonate at the signal having a frequency less than the predetermined frequency.

The third impedance becomes a capacitor component in response to a signal having a frequency greater than the predetermined frequency. The fourth impedance becomes an inductor component in response to a signal having a frequency greater than the predetermined frequency. The capacitor component and the inductor component resonate at the signal having a frequency greater than the predetermined frequency.

DETAILED DESCRIPTION OF THE INVENTION

Figure 1:
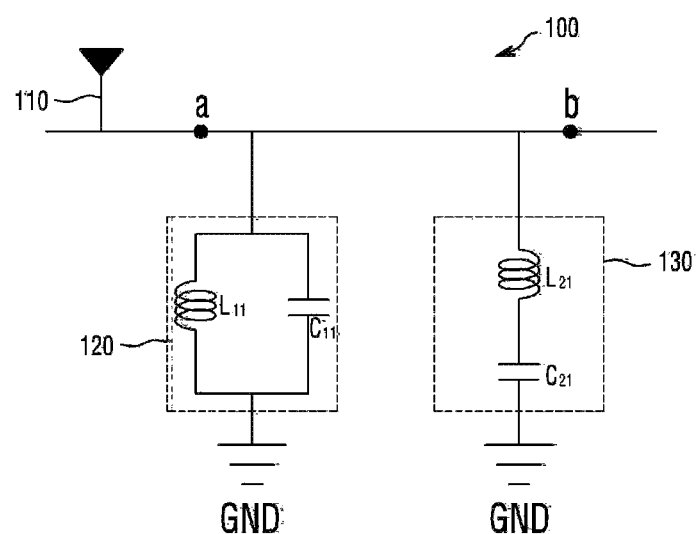
FIG. 1 is a circuit diagram showing an antenna apparatus according to an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

Hereafter, an impedance matching circuit according to an embodiment of the present invention will be described with reference to the accompanying drawings.

Figure 2A:
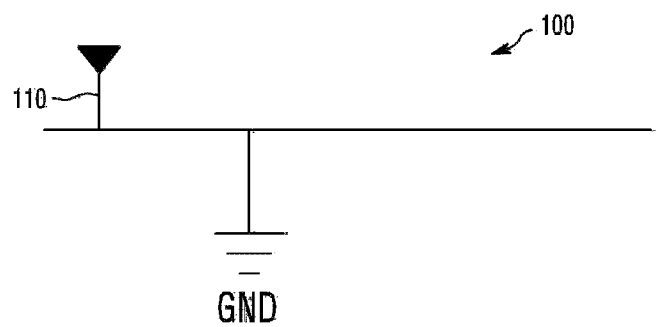
FIGS. 2A to 2C are equivalent circuit diagrams according to a signal which is transmitted to the antenna apparatus shown in FIG. 1.
Figure 2B:
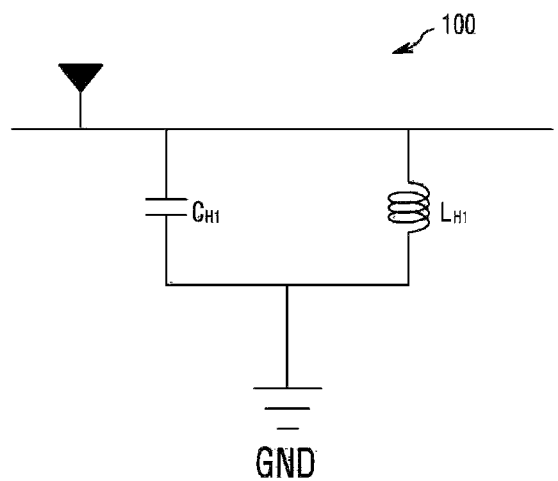
Figure 2C:
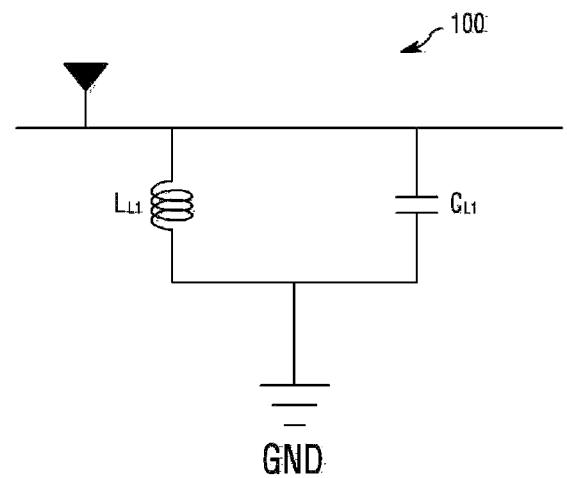

FIG. 1 is a circuit diagram showing an antenna apparatus according to an embodiment of the present invention. FIGS. 2A to 2C are equivalent circuit diagrams according to a signal which is transmitted to the antenna apparatus shown in FIG. 1. FIG. 2A is an equivalent circuit diagram of the antenna apparatus when the signal having a predetermined frequency is transmitted to the radiating metal. FIG. 2B is an equivalent circuit diagram of the antenna apparatus when the signal having a frequency greater than the predetermined frequency is transmitted to the radiating metal. FIG. 2C is an equivalent circuit diagram of the antenna apparatus when the signal having a frequency less than the predetermined frequency is transmitted to the radiating metal.

Referring to FIG. 1, an antenna apparatus 100 may include a radiating metal 110, a first impedance 120 and a second impedance 130. The first impedance 120 is connected between the radiating metal 110 and a ground (GND), has an impedance value which is changed depending on a frequency, and resonates in response to a predetermined frequency, so that an open-circuit occurs between the radiating metal 110 and the ground (GND). The second impedance 130 is connected between the radiating metal 110 and the ground (GND), has an impedance value which is changed depending on a frequency, and resonates in response to the predetermined frequency, so that a short-circuit occurs between the radiating metal 110 and the ground (GND).

In the antenna apparatus 100, a signal belonging to a low frequency band and a signal belonging to a high frequency band may resonate in one radiating metal 110. Also, in the antenna apparatus 100, two radiating metals 110 may transmit and receive the signal belonging to the low frequency band and the signal belonging to the high frequency band, respectively. In order that the signal belonging to the low frequency band and the signal belonging to the high frequency band may resonate in the radiating metal 110, the first impedance 120 and the second impedance 130 may be connected in parallel between the radiating metal 110 and the ground (GND). The impedance value of each of the first impedance 120 and the second impedance 130 may be changed in response to the frequency of the signal which is transmitted to the radiating metal 110. Also, each of the first impedance 120 and the second impedance 130 may resonate in response to a predetermined frequency.

When a signal having a predetermined frequency is transmitted to and received from the radiating metal 110, the first impedance 120 and the second impedance 130 may resonate in response to the predetermined frequency respectively. When the transmitted/received signal resonates in the first impedance 120, the impedance value of the first impedance 120 may increase infinitely, and when the transmitted/received signal resonates in the second impedance 130, the impedance value of the second impedance 130 may become 0. When the impedance value of the first impedance 120 becomes infinite and the impedance value of the second impedance 130 becomes 0, the radiating metal 110 of the antenna apparatus 100 may be, as shown in FIG. 2A, connected to the ground (GND). Accordingly, the signal transmitted to and received from the radiating metal 110 is transmitted to the ground (GND), so that the signal may not be transmitted to an external device (not shown) connected to the antenna apparatus 100.

When the signal belonging to a high frequency band having a frequency greater than the predetermined frequency is transmitted to and received from the radiating metal 110, the first impedance 120 of the antenna apparatus 100 may, as shown in FIG. 2B, have a capacitor component "$C_{H1}$" and the second impedance 130 of the antenna apparatus 100 may have an inductor component "$L_{H1}$". A specific high frequency band signal among the high frequency band signals which are transmitted to and received from the radiating metal 110 may resonate by the capacitor component "$C_{H1}$" of the first impedance 120 and the inductor component "$L_{H1}$" of the second impedance 130.

Also, when the signal belonging to a low frequency band having a frequency less than the predetermined frequency is transmitted to and received from the radiating metal 110, the first impedance 120 of the antenna apparatus 100 may, as shown in FIG. 2C, have an inductor component "$L_{L1}$" and the second impedance 130 of the antenna apparatus 100 may have a capacitor component "$C_{L1}$". A specific low frequency band signal among the low frequency band signals which are transmitted to and received from the radiating metal 110 may resonate by the inductor component "$L_{L1}$" of the first impedance 120 and the capacitor component "$C_{L1}$" of the second impedance 130.

The impedance component value of each of the first impedance 120 and the second impedance 130 may change in response to the signal which is transmitted to and received from the radiating metal 110. Therefore, the impedance values of the first impedance 120 and the second impedance 130 when the signal belonging to the high frequency band is transmitted to and received from the radiating metal 110 may be different from those of the first impedance 120 and the second impedance 130 when the signal belonging to the low frequency band is transmitted to and received from the radiating metal 110. Although one first impedance 120 and one second impedance 130 are shown, a plurality of the first impedances 120 and a plurality of the second impedances 130 may be provided without being limited to this.

The impedance component values of the first impedance 120 and the second impedance 130 may be changed according to the frequency of the signal which is transmitted to and received from the radiating metal 110. Therefore, the signal may resonate both when the signal belonging to the high frequency band is transmitted to and received from the radiating metal 110 by the first impedance 120 and the second impedance 130 and when the signal belonging to the low frequency band is transmitted to and received from the radiating metal 110 by the first impedance 120 and the second impedance 130. For example, the low frequency band signal resonating in the radiating metal 110 may have 850 MHz and the high frequency band signal resonating in the radiating metal 110 may have 1850 MHz. Also, the predetermined frequency may use the average frequency of the frequency of the low frequency band signal and the frequency of the high frequency band signal. However, there is no limit to this. A frequency close to the average frequency of the frequency of the low frequency band signal and the frequency of the high frequency band signal can be used. For example, when the frequency of the low frequency band signal is 850 MHz and the frequency of the high frequency band signal is 1850 MHz, the predetermined frequency may be 1250 MHz.

In the embodiment, in the first impedance 120, an inductor L11 and a capacitor C11 may be connected in parallel to each other. In the second impedance 130, an inductor L21 and a capacitor C21 may be connected in series to each other.

Therefore, the antenna apparatus 100 can resonate in response to the high frequency band signal and can resonate in response to the low frequency band signal, thereby causing the high frequency band signal and the low frequency band signal to have a broader band.

Figure 3A:
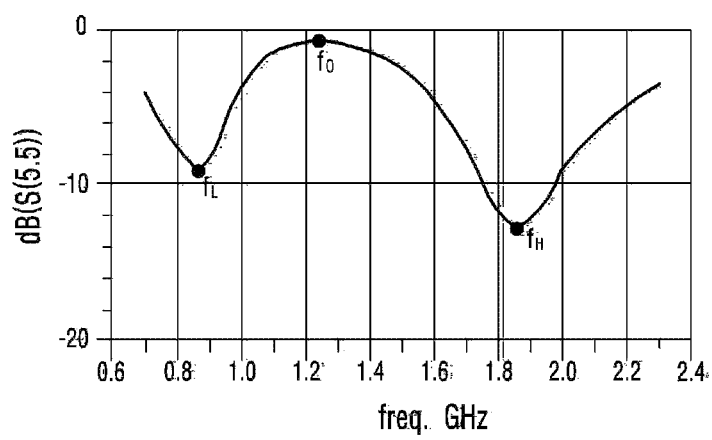
FIGS. 3A and 3B are views showing matching characteristics of a frequency of a random signal which is transmitted to the antenna device shown in FIG. 1.
Figure 3B:
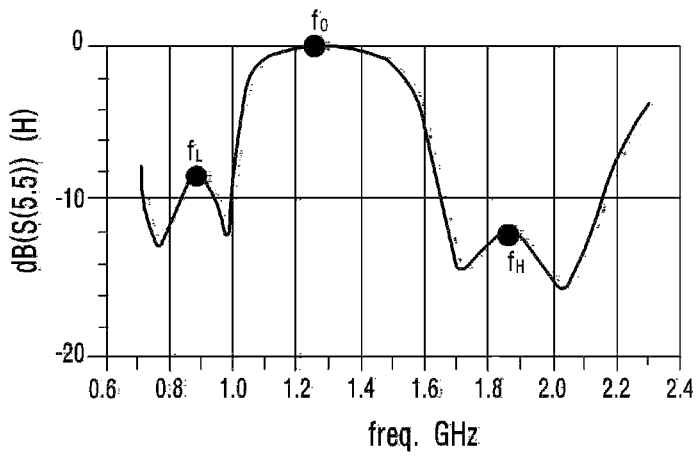
Figure 4A:
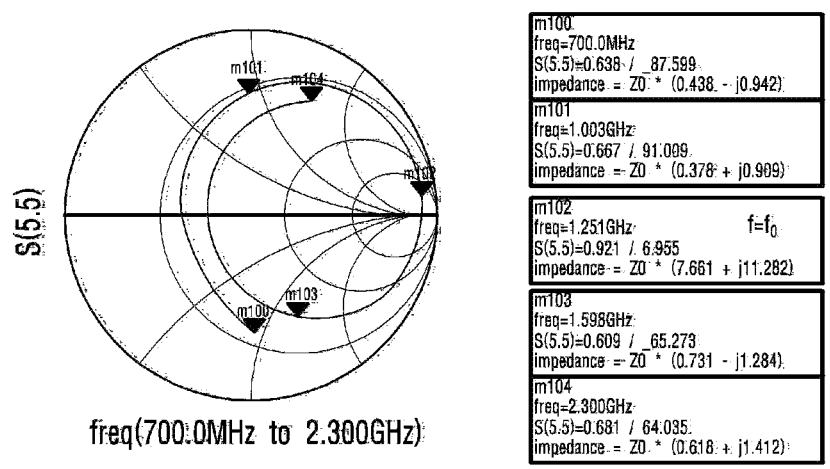
FIG. 4A is a view showing Smith chart corresponding to FIG. 3A.
Figure 4B:
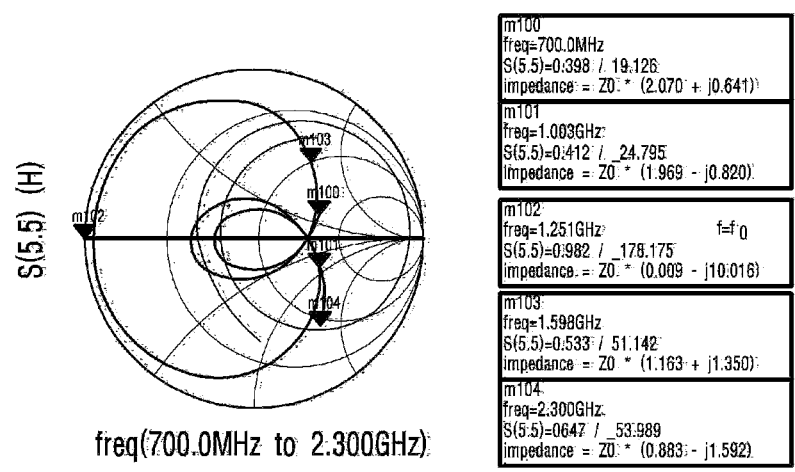
FIG. 4B is a view showing Smith chart corresponding to FIG. 3B.

FIGS. 3A and 3B are views showing matching characteristics of a frequency of a random signal which is transmitted to the antenna apparatus shown in FIG. 1. FIG. 4A is a view showing Smith chart corresponding to FIG. 3A. FIG. 4B is a view showing Smith chart corresponding to FIG. 3B. FIG. 3A may show the matching characteristics of the frequency of the signal at a point "a" of the radiating metal. FIG. 3B may show the matching characteristics of the frequency of the signal at a point "b" of the radiating metal.

When a signal having a frequency between 700 MHz and 2300 MHz is transmitted to and received from the radiating metal 110 shown in FIG. 1, the frequency and the matching characteristics at the point "a" in FIG. 1 can be represented as shown in FIG. 3A. Also, Smith chart is represented as shown in FIG. 4A. That is, when the signal having a frequency of about 850 MHz is transmitted to the radiating metal 110 and when the signal having a frequency of about 1850 MHz is transmitted to the radiating metal 110, it can be seen that one Pole is formed respectively. Therefore, it can be understood that the transmission loss can be minimized when the signal having a frequency of about 850 MHz and the signal having a frequency of about 1850 MHz are transmitted to and received from the radiating metal 110. Further, it can be found that when the frequency is 1250 MHz, the matching does not occur. The frequency and gain relationship at the point "b" in FIG. 1 may be represented as shown in FIG. 3B. Also, Smith chart is represented as shown in FIG. 4B. Describing the frequency and gain relationship by using FIGS. 3B and 4, when a signal having a frequency between about 790 MHz and 980 MHz is transmitted to the radiating metal 110 and when a signal having a frequency between about 1700 MHz and 2100 MHz is transmitted to the radiating metal 110, it can be discovered that two Poles are formed respectively. In other words, two Poles are formed at the low frequency band and the high frequency band respectively by the first impedance 120 and the second impedance 130. As a result, the range of the frequency having a low transmission loss is increased and the signal having a broader band may be transmitted and received. When the frequency is 1250 MHz, the signal which is transmitted to and received from the radiating metal is transmitted to the ground, so that the matching does not occur.

Figure 5:
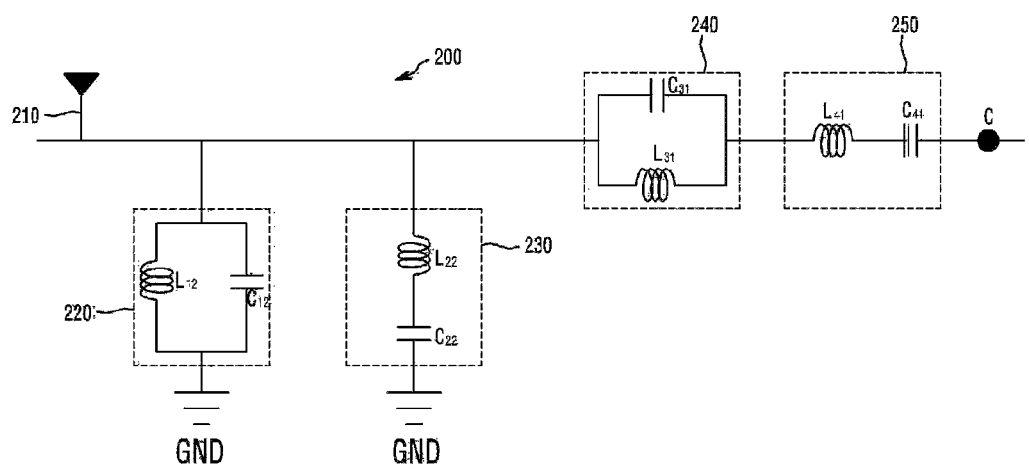
FIG. 5 is a circuit diagram showing an antenna apparatus according to another embodiment of the present invention.
Figure 6A:
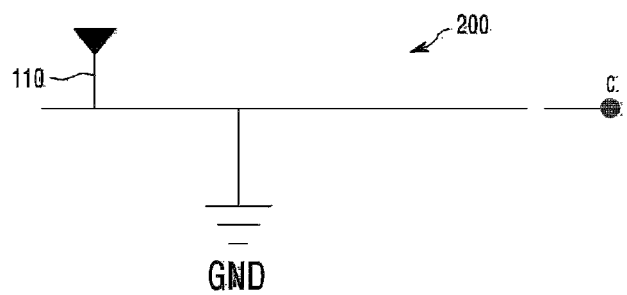
FIGS. 6A to 6C are equivalent circuit diagrams according to a signal which is transmitted to the antenna apparatus shown in FIG. 5.
Figure 6B:
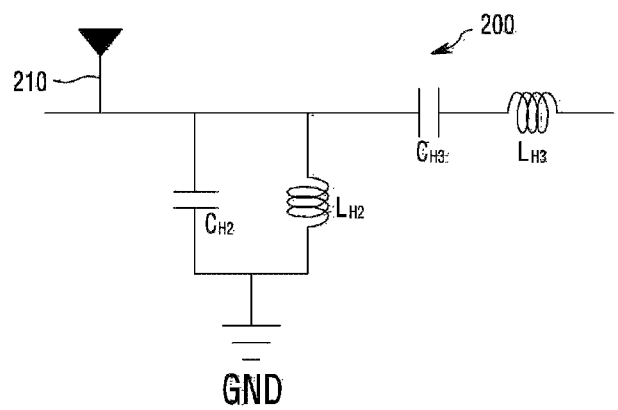
Figure 6C:
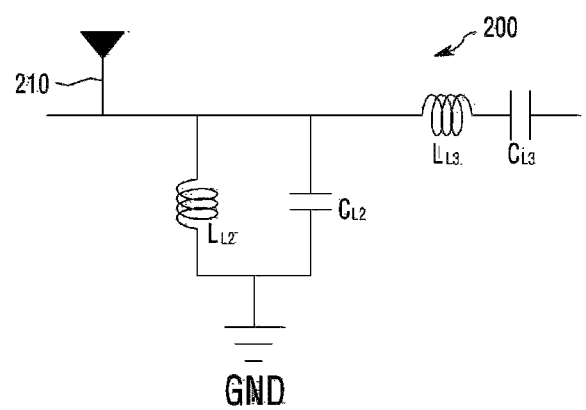

FIG. 5 is a circuit diagram showing an antenna apparatus according to another embodiment of the present invention. FIGS. 6A to 6C are equivalent circuit diagrams according to a signal which is transmitted to the antenna apparatus shown in FIG. 5. FIG. 6A is an equivalent circuit diagram of the antenna apparatus when the signal having a predetermined frequency is transmitted to the radiating metal. FIG. 6B is an equivalent circuit diagram of the antenna apparatus when the signal having a frequency greater than the predetermined frequency is transmitted to the radiating metal. FIG. 6C is an equivalent circuit diagram of the antenna apparatus when the signal having a frequency less than the predetermined frequency is transmitted to the radiating metal.

Referring to FIG. 5, an antenna apparatus 200 may include a radiating metal 210, a first impedance 220, a second impedance 230, a third impedance 240 and a fourth impedance 250. The first impedance 220 is connected between the radiating metal 210 and a ground (GND), has an impedance value which is changed depending on the frequency, and resonates in response to a predetermined frequency, so that an open-circuit occurs between the radiating metal 210 and the ground (GND). The second impedance 230 is connected between the radiating metal 210 and a ground (GND), has an impedance value which is changed depending on the frequency, and resonates in response to a predetermined frequency, so that a short-circuit occurs between the radiating metal 210 and the ground (GND). The third impedance 240 is connected in series to the radiating metal 210 and is opened in response to a predetermined frequency. The fourth impedance 250 is connected in series to the radiating metal 210 and is short-circuited in response to the predetermined frequency.

The antenna apparatus 200 shown in FIG. 5 is different from the antenna apparatus 100 shown in FIG. 1 in that the antenna apparatus 200 further includes the third impedance 240 and the fourth impedance 250 which are connected in series to the radiating metal 210. Here only the differences from the antenna apparatus 100 shown in FIG. 1 will be described.

When a signal having a predetermined frequency is transmitted to and received from the radiating metal 210, the impedance value of the third impedance 240 increases infinitely by resonance and the impedance value of the fourth impedance 250 becomes 0 by resonance, so that the antenna apparatus 200 may be represented as shown in FIG. 6A. That is, this may have the same effect as if the radiating metal 210 is disconnected by the third impedance 240. Accordingly, since the radiating metal 210 is connected to the ground (GND) by the second impedance 230 and the radiating metal 210 is in the state that the radiating metal 210 is disconnected from an external device (not shown) by the third impedance 240, the signal is not transmitted to and received from the radiating metal 210, so that the signal transmitted to and received from the radiating metal 210 may not be transmitted to and received from the external device (not shown) connected to the antenna apparatus 200.

When the signal belonging to a high frequency band having a frequency greater than the predetermined frequency is transmitted to and received from the radiating metal 210, the first impedance 220 and the third impedance 240 may have a capacitor component "$C_{H2}$" and a capacitor component "$C_{H3}$" respectively, and the second impedance 230 and the fourth impedance 250 may have an inductor component "$L_{H2}$" and an inductor component "$L_{H3}$" respectively, so that the antenna apparatus 200 may be represented as shown in FIG. 6B. Therefore, the third impedance 240 and the fourth impedance 250 may be connected in series to the radiating metal 210. The high frequency band signal which is transmitted to and received from the radiating metal 210 may resonate by the capacitor component "$C_{H3}$" of the third impedance 240 connected in series to the radiating metal 210 and the inductor component "$L_{H3}$" of the fourth impedance 250 connected in series to the radiating metal 210, so that the high frequency band signal which is transmitted to and received from the radiating metal 210 may bypass the third impedance 240 and the fourth impedance 250.

When the signal belonging to a low frequency band having a frequency less than the predetermined frequency is transmitted to and received from the radiating metal 210, the first impedance 220 and the third impedance 240 may have inductor components, and the second impedance 230 and the fourth impedance 250 may have capacitor components, so that the antenna apparatus 200 may be represented as shown in FIG. 6C. Therefore, the third impedance 240 and the fourth impedance 250 may be connected in series to the radiating metal 210. The low frequency band signal which is transmitted to and received from the radiating metal 210 may resonate by the inductor component "$L_{L3}$" of the third impedance 240 connected in series to the radiating metal 210 and the capacitor component "$C_{L3}$" of the fourth impedance 250 connected in series to the radiating metal 210, so that the low frequency band signal which is transmitted to and received from the radiating metal 210 may bypass the third impedance 240 and the fourth impedance 250. Although one third impedance 240 and one fourth impedance 250 are shown, a plurality of the third impedances 240 and a plurality of the fourth impedances 250 may be provided without being limited to this.

In the embodiment, in the third impedance 240, an inductor L31 and a capacitor C31 may be connected in parallel to each other. In the fourth impedance 250, an inductor L41 and a capacitor C41 may be connected in series to each other. Also, the low frequency band signal may have 850 MHz and the high frequency band signal may have 1850 MHz. Also, the predetermined frequency may be 1250 MHz.

Therefore, the antenna apparatus 100 can resonate in response to the high frequency band signal and can resonate in response to the low frequency band signal, thereby causing the high frequency band signal and the low frequency band signal to have a broader band.

In the above description, although all of the first, second, third and fourth impedances 220, 230, 240 and 250 are connected to the radiating metal 210, there is no limit to this. Only the first and second impedances 220 and 230 may be connected to the radiating metal 210, or only the third and fourth impedances 240 and 250 may be connected to the radiating metal 210.

Figure 7:
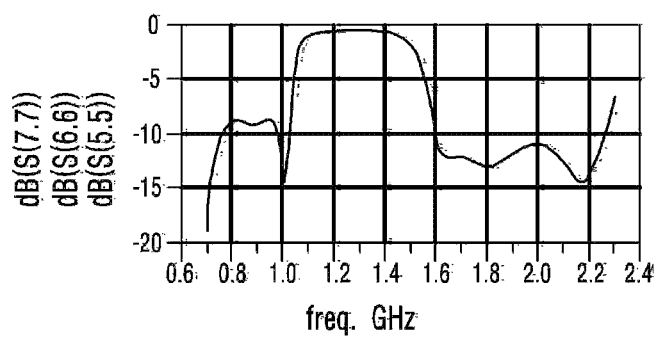
FIG. 7 is a view showing matching characteristics of a frequency of a random signal which is transmitted to the antenna device shown in FIG. 5.
Figure 8:
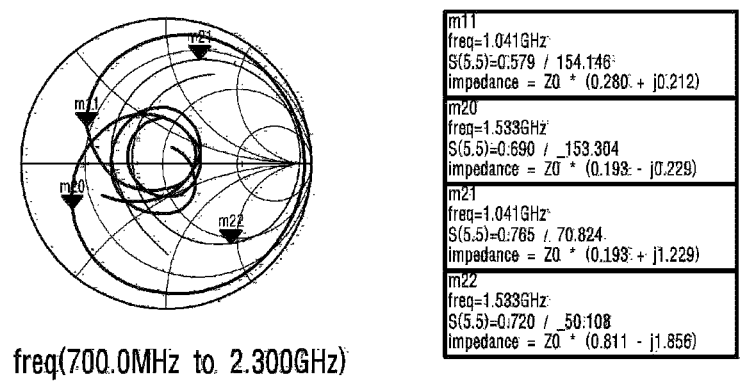
FIG. 8 is a view showing Smith chart corresponding to FIG. 7.

FIG. 7 is a view showing matching characteristics of the frequency of a random signal which is transmitted to the antenna device shown in FIG. 5. FIG. 8 is a view showing Smith chart corresponding to FIG. 7.

Referring to FIGS. 7 and 8, when a signal having a frequency between 700 MHz and 2300 MHz is transmitted to and received from the radiating metal 210 shown in FIG. 5, the frequency and gain relationship at the point "C" may be represented as shown in FIG. 7. Also, Smith chart is represented as shown in FIG. 8. When a signal having a frequency of about 850 MHz is transmitted to and received from the radiating metal 210 and when a signal having a frequency of about 1850 MHz is transmitted to and received from the radiating metal 210, it can be discovered that the Pole is formed respectively. The range of the frequency capable of minimizing the transmission loss at one Pole is increased, so that it is possible to greatly increase the range of the frequency capable of minimizing the transmission loss of the signal which is transmitted to and received from the radiating metal 210. Accordingly, it can be understood that the signal becomes to have a broader band. It can be found that when the frequency is 1250 MHz, the signal is transmitted to the ground and the matching does not occur.

Figure 9:
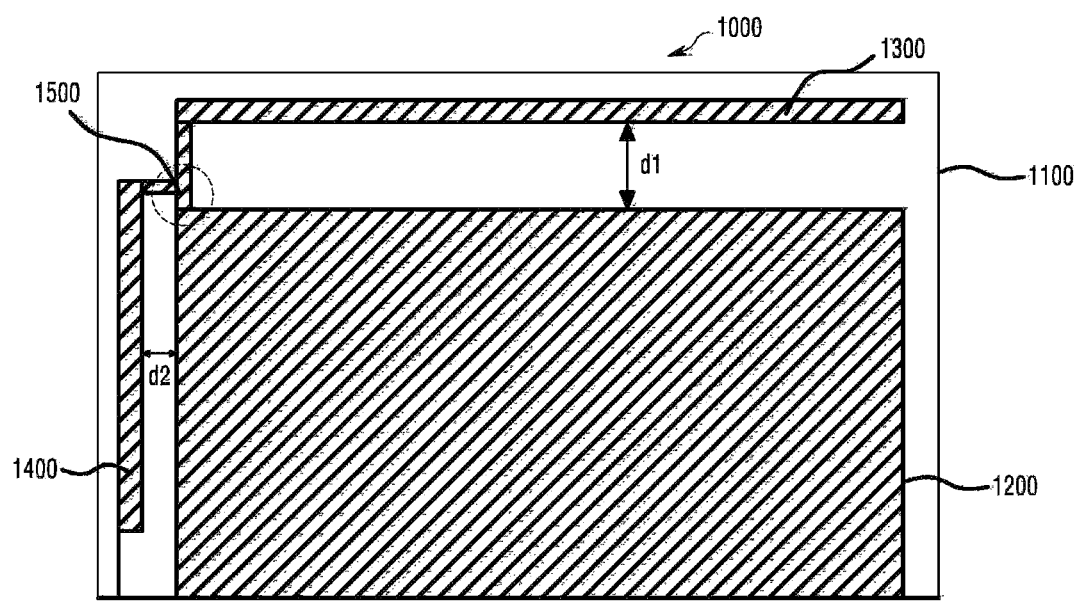
FIG. 9 is a structure view showing a structure of the antenna apparatus according to the present invention.

FIG. 9 is a structure view showing a structure of the antenna apparatus according to the present invention.

Referring to FIG. 9, in an antenna apparatus 1000, an electrode 1200 is formed on a substrate 1100 and may be used as a ground. A first radiating metal 1300 may be formed on the substrate 1100 in one direction. A second radiating metal 1400 may be formed in a direction perpendicular to the direction in which the first radiating metal 1300 is formed. The first radiating metal 1300 may be longer than the second radiating metal 1400. The first radiating metal 1300, the second radiating metal 1400 and the electrode 1200 may be connected to a feed 1500. A signal having a low frequency band may be transmitted to and received from the first radiating metal 1300. A signal having a high frequency band may be transmitted to and received from the second radiating metal 1400. The frequency of the signal having a low frequency band may be 850 MHz and the frequency of the signal having a high frequency band may be 1850 MHz. A distance "d1" between the first radiating metal 1300 and the electrode 1200 may be 8 mm and a distance "d2" between the second radiating metal 1400 and the electrode 1200 may be 3 mm.

Also, here, although the antenna apparatus has been described based on an Inverted L antenna, the antenna apparatus is not limited to this.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. An antenna apparatus comprising:
   a radiating metal;
   a first impedance which is connected between the radiating metal and a ground, has an impedance value which is changed depending on a frequency, and resonates in response to a predetermined frequency, so that an open-circuit occurs between the radiating metal and the ground at the predetermined frequency; and
   a second impedance which is connected between the radiating metal and the ground, has an impedance value which is changed depending on a frequency, and resonates in response to the predetermined frequency, so that a short-circuit occurs between the radiating metal and the ground at the predetermined frequency;
   wherein a first inductor and a first capacitor of the first impedance are connected in parallel to each other;
   wherein a second inductor and a second capacitor of the second impedance are connected in series to each other;

wherein the first impedance becomes an inductor component in response to a signal having a frequency less than the predetermined frequency, wherein the second impedance becomes a capacitor component in response to the signal having a frequency less than the predetermined frequency, and wherein the inductor component and the capacitor component resonate at the signal having a frequency less than the predetermined frequency; and wherein the first impedance becomes a capacitor component in response to a signal having a frequency greater than the predetermined frequency, wherein the second impedance becomes an inductor component in response to the signal having a frequency greater than the predetermined frequency, and wherein the capacitor component and the inductor component resonate at the signal having a frequency greater than the predetermined frequency.

2. The antenna apparatus of claim 1, comprising a third impedance and a fourth impedance which are connected in series to the radiating metal, wherein the third impedance is opened in response to the predetermined frequency, and wherein the fourth impedance is short-circuited in response to the predetermined frequency.

3. The antenna apparatus of claim 2, wherein a third inductor and a third capacitor of the third impedance are connected in parallel to each other.

4. The antenna apparatus of claim 3, wherein a fourth inductor and a fourth capacitor of the fourth impedance are connected in series to each other.

5. The antenna apparatus of claim 2, wherein the third impedance becomes an inductor component in response to the signal having a frequency less than the predetermined frequency, wherein the fourth impedance becomes a capacitor property in response to the signal having a frequency less than the predetermined frequency, and wherein the inductor component and the capacitor component resonate at the signal having a frequency less than the predetermined frequency.

6. The antenna apparatus of claim 2, wherein the third impedance becomes a capacitor component in response to the signal having a frequency greater than the predetermined frequency, wherein the fourth impedance becomes an inductor component in response to the signal having a frequency greater than the predetermined frequency, and wherein the capacitor component and the inductor component resonate at the signal having a frequency greater than the predetermined frequency.

7. The antenna apparatus of claim 1, wherein the radiating metal comprises a first radiating metal which resonates in response to the signal having a lower frequency than the predetermined frequency, and comprises a second radiating metal which resonates in response to the signal having a frequency greater than the predetermined frequency.

8. An antenna apparatus comprising:
a radiating metal;
a third impedance having a first end and an opposite second end, the first end is connected to the radiating metal; and
a fourth impedance of which one end is connected to the second end of the third impedance;
wherein the third impedance is opened in response to a predetermined frequency, and the fourth impedance is short-circuited in response to the predetermined frequency;
wherein the third impedance becomes an inductor component in response to a signal having a frequency less than the predetermined frequency, wherein the fourth impedance becomes a capacitor component in response to a signal having a frequency less than the predetermined frequency, and wherein the inductor component and the capacitor component resonate at the signal having a frequency less than the predetermined frequency; and
wherein the third impedance becomes a capacitor component in response to a signal having a frequency greater than the predetermined frequency, wherein the fourth impedance becomes an inductor component in response to a signal having a frequency greater than the predetermined frequency, and wherein the capacitor component and the inductor component resonate at the signal having a frequency greater than the predetermined frequency.

9. The antenna apparatus of claim 8, wherein a third inductor and a third capacitor of the third impedance are connected in parallel to each other.

10. The antenna apparatus of claim 8, wherein a fourth inductor and a fourth capacitor of the fourth impedance are connected in series to each other.

11. The antenna apparatus of claim 8, comprising:
a first impedance which is connected between the radiating metal and a ground, has an impedance value which is changed depending on a frequency, and resonates in response to the predetermined frequency, so that an open-circuit occurs between the radiating metal and the ground; and
a second impedance which is connected between the radiating metal and the ground, has an impedance value which is changed depending on a frequency, and resonates in response to the predetermined frequency, so that a short-circuit occurs between the radiating metal and the ground.

12. The antenna apparatus of claim 8, wherein the radiating metal comprises a first radiating metal which resonates in response to a signal having a frequency less than the predetermined frequency, and comprises a second radiating metal which resonates in response to a signal having a frequency greater than the predetermined frequency.

* * * * *